United States Patent [19]

Tago et al.

[11] Patent Number: 4,659,927
[45] Date of Patent: Apr. 21, 1987

[54] IMAGE TRANSFER APPARATUS AND METHOD

[75] Inventors: Tomohisa Tago, Shizuoka; Shinji Hamada, Kanagawa; Shinichi Ichikawa, Kanagawa; Yoshimoto Tanase, Kanagawa, all of Japan

[73] Assignee: Fuji Photo Film Co., Ltd., Kanagawa, Japan

[21] Appl. No.: 739,596

[22] Filed: May 31, 1985

[30] Foreign Application Priority Data

May 31, 1984 [JP] Japan ................................ 59-112020
May 31, 1984 [JP] Japan ................................ 59-112021

[51] Int. Cl.$^4$ ........................... G03C 5/16; H05B 1/00
[52] U.S. Cl. .................................. 250/318; 219/216; 250/319
[58] Field of Search .................. 250/318, 319, 317.1, 250/316.1; 271/232, 241; 355/3 TR; 219/216, 244, 469

[56] References Cited

U.S. PATENT DOCUMENTS

| | | | |
|---|---|---|---|
| 3,129,328 | 4/1964 | Wedel | 250/319 |
| 3,813,516 | 5/1974 | Kudsi et al. | 219/471 |
| 3,823,317 | 7/1974 | Ritzerfeld | 250/318 |
| 4,071,735 | 1/1978 | Moser | 219/216 |
| 4,473,652 | 9/1984 | Okazaki et al. | 436/536 |
| 4,506,442 | 3/1985 | Alzmann et al. | 29/830 |
| 4,512,650 | 4/1985 | Kocher | 355/3 FU |

Primary Examiner—Janice A. Howell
Assistant Examiner—Constantine Hannaher
Attorney, Agent, or Firm—Sughrue, Mion, Zinn, Macpeak & Seas

[57] ABSTRACT

A method for transferring an image from an image sheet to an image-receiving sheet while the sheets are superposed, and an apparatus therefor. A support plate of good thermal conductivity and rigidity is placed against the sheets, and a cover sheet superposed remotely from the support plate. The resulting assembly is passed through a pair of heated rollers. Cooling rollers may cool the superposed sheets following image transfer. Additional cooling may be provided.

13 Claims, 8 Drawing Figures

IMAGE TRANSFER APPARATUS AND METHOD

BACKGROUND OF THE INVENTION

The present invention relates to an image transfer apparatus and a method, and more particularly to a method for preparing a color proof by way of image transfer in a reproduction process.

For producing a number of prints with a printing plate constructed of a reproducing material, for example, a PS (presensitized) plate, from a color original, it is customary to generate halftone negatives or halftone positives in four colors from the color original with a color scanner, then patch up, reverse, and retouch the halftone negatives or halftone positives to produce a single four-color positive, make a proof for correction or examination, and thereafter produce final prints. In the process of preparing the halftone negatives or positives, it is necessary to check color separation in the color scanner. The process of making the single positive requires checking of the patching-up and other steps. These checking steps are required for a better printing finish. Also, in the process of making the proof, the order of the prints has to be confirmed.

To meet the above checking requirements, it has been the conventional practice to prepare a color proof. The color proof is made of a photosensitive material used for a silver-salt photographic system or an electrophotographic system, or a photosensitive material of photopolymer. Color images have been formed by using pigments or dyes. The color proof can be prepared by either a negative-positive system or a positive-positive system.

An example of making such a color proof will be described. A photosensitive material composed of a support and a photosensitive layer disposed thereon is pressed against a transfer sheet of paper with heat to transfer the photosensitive layer to the transfer sheet, and then an image of a first color is formed on the transfer sheet by exposure and development. Likewise, a second photosensitive layer is transferred to the transfer sheet on the first-color image, and an image of a second color is thereafter formed thereon by exposure and development. The above process is repeated by exposure and development. The above process is repeated four times for yellow, magenta, cyan, and black to produce a multicolor image.

The photosensitive layer can be transferred to the transfer sheet in various ways, such as by pressing the layer against the transfer sheet with or without heat. As an example, one or both of a pair of rollers are employed as heated rollers, and the photosensitive material with the photosensitive layer and the transfer sheet are passed in superposed relation between the heated rollers for transferring the photosensitive layer to the transfer sheet.

According to the present invention, a photosensitive material is exposed to an image, and a developed image is transferred to an image-receiving sheet to produce a color proof. A multicolor image can be formed by preparing color images of yellow, magenta, cyan, and black, and then transferring these color images successively to one image-receiving sheet. With this method, since the formed images are successively transferred color by color, a higher accuracy for image transfer is required than would be the case in which images are formed by exposing photosensitive layers transferred to a transfer sheet. More specifically, since the ability for the images to be transferred to the image-receiving sheet is largely dependent on the transfer temperature, the temperature at which the images are to be transferred should be strictly controlled. Where a general transfer apparatus is employed, it has heretofore been necessary to employ a considerably high transfer temperature as the heating time is short. Therefore, the sheet inserted between the sheets is subjected to local elongation, causing misregistration of colors in the transferred images and transfer irregularities.

The photosensitive material or image sheet and the image-receiving sheet are formed of a soft material. When an image is transferred or the sheets are pressed by the heated rollers, the superposed sheets tend to be warped, positionally displaced from each other, or wrinkled, resulting in a reduction in the sharpness of the transferred image. Especially when producing a color proof, because normally four image transfer cycles are necessary, misregistration of colors is a serious problem.

Moreover, inasmuch as the temperature is required to be elevated to a considerably high level, the heater employed has to have a large thermal capacity, and accordingly the entire device is large in size and has a large electric power consumption. When the superposed sheets are inserted between the heated rollers, the heated rollers are subjected to a localized temperature reduction, thereby causing a color shift in the transferred image. Dependent on the size of a sheet to which an image is to be transferred, the heated rollers generally make several revolutions before the sheets pass through the transfer device. Therefore, the heated rollers have portions subjected to different surface temperatures as such portions contact the sheets in the first and following revolutions. As a result, the transfer temperature is lowered with time as the rollers rotate, thus causing transfer irregularities. Furthermore, since images are transferred normally from four image sheets to a single image-receiving sheet, the colors are liable to be shifted from one another.

SUMMARY OF THE INVENTION

With the foregoing drawbacks in view, it is an object of the present invention to provide a transfer device for producing a color proof by transferring images smoothly without causing transfer irregularities and misregistration of colors.

It is a further object of the present invention to provide an image transfer method capable of preventing superposed image and image-receiving sheets from being wrinkled or positionally displaced from each other in the process of image transfer.

The above objects can be achieved by an image transfer device for transferring an image from an image sheet image-receiving sheet while the sheets are superposed, comprising preheating means for preheating the superposed sheets; heated rollers for simultaneously feeding, heating, and pressing the superposed sheets preheated by the preheater; and rollers for feeding the superposed sheets between which the image has been transferred by the heated rollers. The feeding rollers may be cooling rollers for cooling the superposed sheets. the image transfer device may further comprise additional cooling means for cooling the superposed sheets.

The above objects can further be achieved by an image transfer device for transferring an image from an image sheet to an image-receiving sheet while the sheets are superposed, comprising preheating means for preheating the superposed sheets; heated rollers for simultaneously feeding, heating, and pressing the superposed sheets preheated by the preheater; cooling rollers for feeding and cooling the superposed sheets between which the image has been transferred by the heat rollers; and cooling means for additionally cooling the superposed sheets cooled by the cooling rollers.

Still further, the above objects can be achieved by a transfer method for transferring an image by superposing an image sheet with the image formed thereon upon an image-receiving sheet and pressing or pressing and heating the two sheets, the transfer method comprising the steps of placing a support plate of good thermal conductivity and rigidity against the sheets, superposing a cover sheet remotely from the support plate, and thereafter transferring the image.

DESCRIPTION OF THE PREFERRED EMBODIMENTS

An image transfer device according to the present invention will hereinafter be described in detail with reference to FIGS. 2 to 3.

Figure 2:
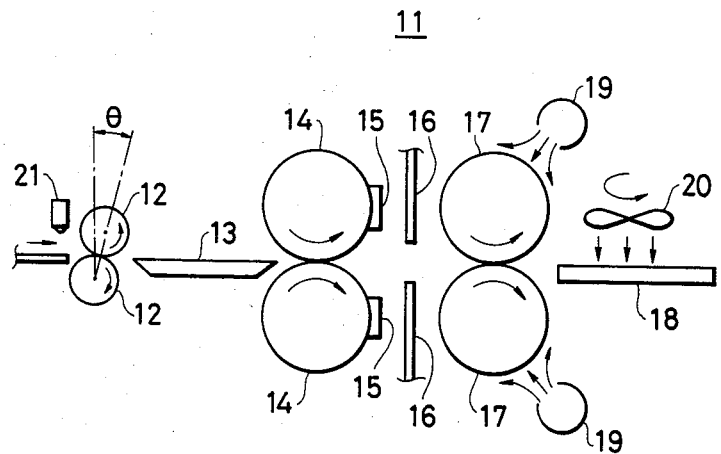
FIG. 2 is a fragmentary schematic side elevational view of an image transfer device according to a preferred embodiment of the present invention.

Referring now to FIG. 2, there is shown therein a schematic side elevational view of an image transfer device according to a preferred embodiment of the present invention. As shown in FIG. 2, an image sheet on which an image is formed and an image-receiving sheet are superposed and inserted between and past a pair of insertion rollers 12. At this point, a support plate for reinforcing and guiding the image sheet and the image-receiving sheet and a cover sheet for protecting the sheets may be superposed upon the sheets. The reinforcing and guiding support plate should preferably be made of a material having a good thermal conductivity, such as aluminum.

A transfer device 11 has either a non-contact or contact-type sensor 21 for detecting the insertion of the superposed sheets to operate the transfer device 11, the pair of insertion rollers 12, a plate heater 13 for preheating the superposed sheets as fed from the insertion rollers 12, and a pair of heated rollers 14 for sandwiching and feeding the superposed sheets as heated by the plate heater 13 and heating the superposed sheets up to about 150° C. under pressure. The transfer device 11 also includes a pair of rollers 17 for sandwiching and feeding the superposed sheets between which the image has been transferred by the heated rollers 14; the rollers 17 may be rollers for cooling the superposed sheets to a predetermined temperature. The image transfer device may further be provided with a cooling section composed of a cooling plate 18 and a cooling fan 20 for additionally cooling the superposed sheets, temperature sensors 15 for controlling the temperature of the heated rollers 14, slitted pipes 19 for blowing cool air against the cooling rollers 17, and thermally insulating member 16 for preventing the heat of the heated rollers 14 from being transferred to the rollers 17.

The upper insertion roller 12 is angularly displaced from the lower insertion roller 12 toward the plate heater 13 by an angle of $\theta$ for feeding the superimposed sheets while contacting the plate heater 13 so that the superimposed sheets can be well heated. The plate heater 13 serves to minimize any temperature reduction of the heated rollers 14 as they process the superimposed sheets, and also to preheat the sheets to thereby avoid abrupt heating thereof. The plate heater 13 is heated to a temperature controlled by the temperature sensors 15.

The heated rollers 14 each accommodate a Nichrome wire and a heat-radiating lamp such as a halogen lamp, and are rotatable for heating and pressing the superimposed sheets to effect reliable transfer of the image between the sheets. The heated rollers 14 have surface layers which should preferably be formed of heat-resistant rubber or metal. Although the temperature of the heated rollers 14 is controlled by the temperature sensors 15 to a level suitable for image transfer operations, the heated rollers 14 may additionally be heated on their surfaces with heat radiated by an auxiliary heating device such as a heat-radiating lamp to prevent a temperature reduction on the roller surfaces which would otherwise occur each time a superimposed sheet passed the heat rollers 14.

The feeding rollers 17 which feed the superposed sheets may be effective to make the superposed sheets easier to handle by cooling the sheets. More specifically, in the ordinary process of preparing a color proof, images of four colors are transferred, and hence four transfer cycles have to be repeated. The feeding rollers 17 are employed to increase the efficiency of such repeated image transfer operations. Each of the feeding rollers 17 is constructed of heat-resistant rubber or metal, and may have its outer surface cooled by cool air blown from one of the slitted pipes 19.

Rather than cooling the outer surfaces of the feeding rollers 17 with cool air from the slitted pipes 19, the feeding rollers 17 may be cooled by a cooling medium or cool air passed therethrough.

The cooling plate 18 is made of a metal with good thermal conductivity, such as aluminum, and may be cooled by a cooling medium passing therethrough. The cooling fan 20 cools the superimposed sheets from above and also cools the cooling plate 18.

There may be provided a contact-type sensor such as a photoelectric sensor for detecting when the superposed sheets are discharged onto the cooling plate 18.

While in the above embodiment the heated rollers 14 and the feeding rollers 17 are provided in single pairs, they may be provided in plural pairs. Although the transfer device 11 has been described as being started by the sensor 21, the device may be started by a manual switch.

The thermally insulating members 16 which prevent thermal transfer between the plate heater 13 or the heated rollers 14 and the feeding rollers 17 or the cooling plate 18 may be in the form of plates constructed of stainless steel, plastics, foamed plastic, glass wool, or a composite material of these.

Figure 3:
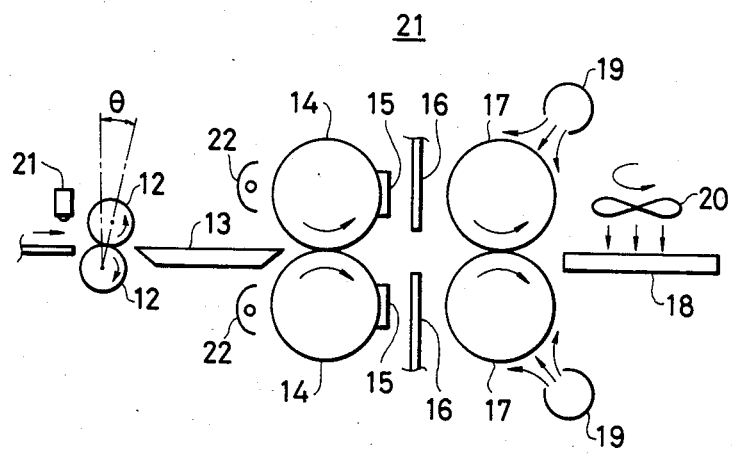
FIG. 3 is a fragmentary schematic side elevational view of a first embodiment of an image transfer device of the invention.

FIG. 3 shows another embodiment in which auxiliary heating units 22 are added to the arrangement of FIG. 2 for preventing the surface temperature of the heated rollers 14 from being locally lowered due to insertion of the sheets. Operation of the auxiliary heating units 22 is started by the temperature sensors 15 upon detection of a certain temperature of the heated rollers 14. Alternatively, the auxiliary heating units 22 may be started, after a predetermined time established by a timer $TM_2$ (see FIG. 6) following the detection of the sheets by the sensor 21.

Each of the auxiliary heating devices 22 may include a reflecting plate for effectively reflecting the radiated heat. The heater may be constructed with a Nichrome wire or a heat-radiating lamp such as a halogen lamp. Since the auxiliary heating units 22 prevent the surface temperature of the heated rollers 14 from being locally lowered due to insertion of the sheets, they should preferably start operation when portions of the heated rollers 14 where the surface temperature has been lowered due to insertion of the sheets reach a position near the auxiliary heating units 22 (when the heated rollers 14 have made about ¾ revolution after the leading ends of the sheets reached the heated rollers 14 in the embodiment of FIG. 3). The auxiliary heating units 22 also should preferably stop operating when the trailing ends of the sheets have left the heated rollers 14 and portions of the heated rollers 14 which contact the trailing ends of the sheets have reached the auxiliary heating units 22 (when the heated rollers 14 have made about ¾ revolution after the trailing ends of the sheets have left the heated rollers 14 in FIG. 3). Such operation may be effected by a combination of the sensor 21 which detects the sheets and a timer, or by a separate sensor. For example, when the trailing ends of the sheets leave the sensor 21, a timer $TM_3$ (FIG. 6) starts and the auxiliary heating units 22 stop after a predetermined time so that the surface temperature of the heated rollers 14 is kept at a constant temperature. The temperature sensors 15 should preferably be disposed in positions out of contact with the sheets (at axial ends of the heated rollers 14) since if the temperature sensors were disposed centrally, widthwise of the heated rollers 14, they would be affected by variations in temperature due to insertion of the sheets, resulting in difficulty in controlling the temperature.

The components other than the auxiliary heating units 22 in the embodiment of FIG. 3 are the same as those shown in FIG. 2.

As described above, the image transfer device 11 of the invention can automatically perform a succession of image transfer steps from the insertion of superimposed sheets to the cooling thereof for thereby increasing the rate and efficiency of image transfer operations.

The image transfer device 11 is arranged such that the superposed sheets are fed to the heated rollers 14 after the sheets have been preheated by the plate heater 13, or the plate heater 13 and the auxiliary heating units 22. With this arrangement, any local temperature reduction of the heated rollers 14 as the sheets are inserted therebetween is suppressed, the temperature thereof stabilized, and the sheets thus prevented from being abruptly heated to guard against transfer irregularities.

Inasmuch as the temperature of the heated rollers 14 can be maintained accurately at a constant level while images are repeatedly transferred between superposed sheets, difficulties such as misregistration, for example, will not occur.

Figure 4:
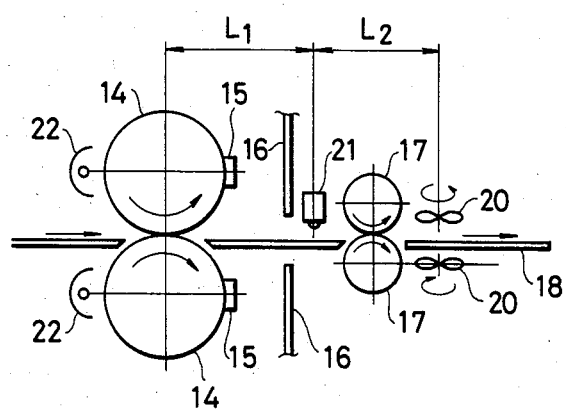
FIG. 4 is a view similar to FIG. 2, showing a second embodiment of an image transfer device of the invention.

FIG. 4 is a schematic view showing another embodiment of the present invention. According to this embodiment, no preliminary heating unit is provided in the apparatus. When a guide plate is inserted in the apparatus, heating and transferring are carried out by heated rollers 14, and thereafter, the auxiliary heating unit 22 and cooling fan 20 are operated simultaneously upon detection of the guide plate by the sensor 21.

The sensor 21 is provided at a distance $L_1$ from the nip between the heated rollers 14 equal to three-quarters of the circumference of one of the heated rollers 14. With this arrangement, it is possible to prevent the surface temperature of the heated roller 14 from decreasing due to contact with the guide plate by operation of the auxiliary heating unit 22 simultaneously with the detection of the guide plate.

If the length $L_1$ shown in FIG. 4 is equal to the distance between the outer peripheral surfaces of the heated rollers 14 and the respective auxiliary heating units 22, the auxiliary heating unit 22 may be controlled by the output of the sensor 21, in which case it is unnecessary to provide a timer. As a result, a simple and economical structure is provided, and no mechanical modification is required, even if the travelling velocity is changed.

In the embodiment shown in FIG. 4, the length $L_1$ is equal to three-quarters of the circumference of one of the heated rollers 14. However, it goes without saying that the length $L_1$ may be set to correspond to the distance between the auxiliary heating units 22 and confronting portion of the respective heated rollers 14.

The operation of the cooling fan 20 is terminated after a predetermined time, established by a timer (not shown), corresponding to movement of a guide plate through a distance $L_2$ after the sensor 21 has detected the guide plate. Alternatively, the fan 20 can be continuously operated.

Figure 5:
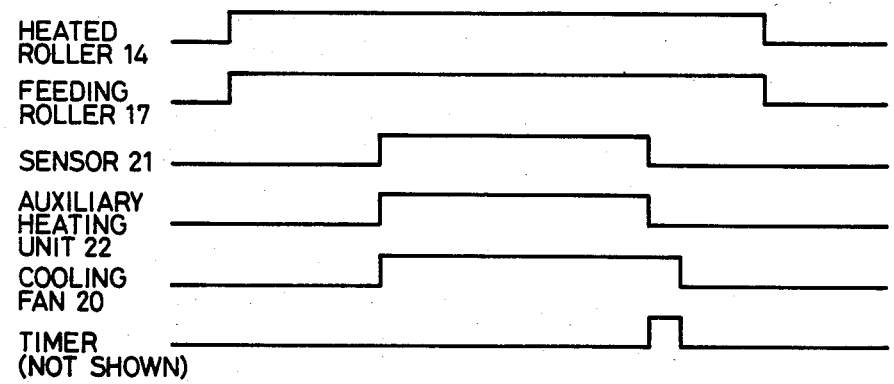
FIG. 5 is a timing diagram illustrating the operations of various elements in the device of FIG. 4.
Figure 6:
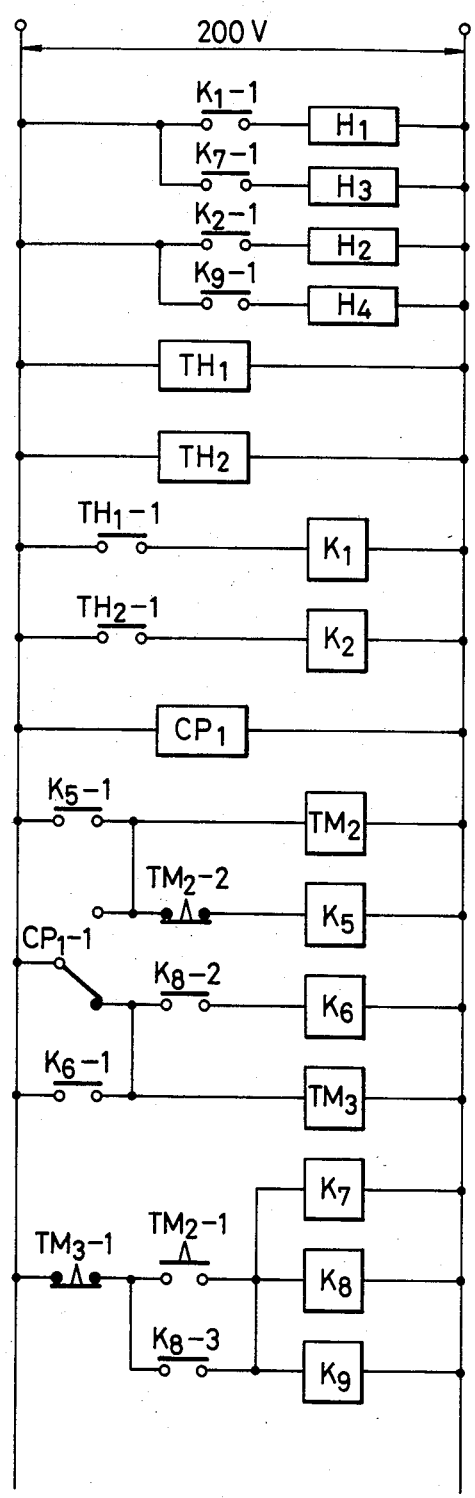
FIG. 6 is an electrical circuit diagram of a control circuit employed to control operations of the device of FIG. 4.

FIG. 5 is a timing diagram indicating a typical sequence of operations of the heated rollers 14, feeding rollers 17, sensor 21, auxiliary heating unit 22, cooling fan 20, and timer. FIG. 6 is an electrical circuit diagram of a control circuit used to control the operations of these units. In FIG. 6, H1 indicates the heating element of the upper heated roller; H2, the heating element of the lower heated roller; H3, the heating element of the upper auxiliary heater; H4, the heating element of the lower auxiliary heater; $TH_1$ and $TH_2$, temperature control units for the upper and lower heated rollers, respectively; $TH_1$-1 and $TH_2$-1, contacts of the temperature control units $TH_1$ and $TH_2$, respectively; $K_1$, $K_2$, $K_5$, $K_6$, $K_7$ and $K_9$, relays; $K_1$-1, $K_2$-1, $K_5$-1, $K_6$-1, $K_7$-1 and $K_9$-1, contacts of the relays $K_1$, $K_2$, $K_5$, $K_6$, $K_7$ and $K_9$, respectively; $K_8$, another relay; $K_8$-1 to $K_8$-3, contacts of the relay $K_8$; $CP_1$, the sensor 21; $CP_1$-1, a switch operated by the output of the sensor $CP_1$; $TM_2$, the timer for determining the ON time of the auxiliary heating unit 22; $TM_2$-1 and $TM_2$-2, contacts of the timer $TM_2$; $TM_3$, the timer for determining the OFF time of the auxiliary heating unit 22; and $TM_3$-1, a contact of the timer $TM_3$. The operation of this circuit is straightforward, effecting the operations discussed above.

An image transfer method according to the present invention will hereinafter be described in detail with reference to FIGS. 1A to 1C.

Figure 1A:
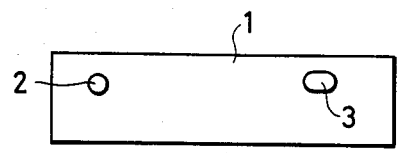
FIGS. 1A to 1C are schematic views illustrating a method according to the present invention.
Figure 1B:
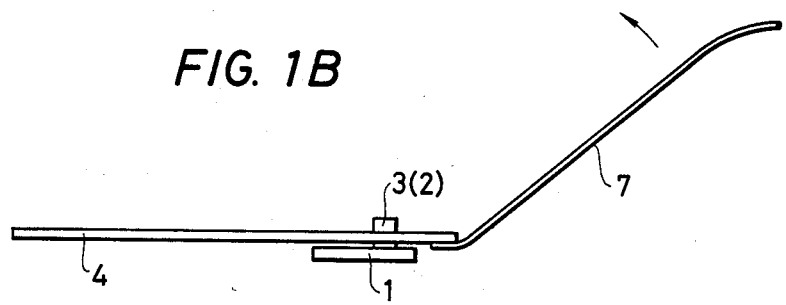
Figure 1C:

FIG. 1A is a plan view of a positioning plate employed in a method of the present invention, FIG. 1B is a side elevational view showing an intermediate step of the method of the present invention, and FIG. 1C is a side elevational view illustrative of a condition after the method of the invention has been completed.

According to the method of the present invention, image sheets on which images are formed after color separation and an image-receiving sheet are first perforated with positioning holes. Then, the image sheets are exposed and developed. The positioning holes are formed in complementary relation to the shapes, for example, circular and oval, of two pins 2 and 3 on a positioning plate 1 shown in FIG. 1A. The differently shaped pins 2 and 3 and the complementarily shaped holes are interfitted to register the images.

Thereafter, the image-receiving sheet, denoted at 5 in FIG. 1C, is placed on a support plate 4 (see FIG. 1B) on which the positioning plate 1 is mounted, and there positioned by the pins 2 and 3. The image sheet, denoted at 6 in FIG. 1C, carrying a first color image to be transferred first, is then placed on the image-receiving sheet 5 and positioned by the pins 2 and 3. A cover sheet 7 is put over the image sheet 6 and mounted in wrapping relation on a front lower surface of the support plate 4, followed by removal of the positioning plate 1. The color sheet may be superposed on the support plate 4 at the front edge thereof.

The support plate 4 is in the form of a thin plate with good thermal conductivity, made, for instance, of aluminum. The support plate 4 has a thickness of about 0.5 mm, taking into account the desired thermal conductivity and rigidness. The support plate 4 has holes through which the pins 2 and 3 can be inserted. For accurately positioning the image sheets 6 for the second and following colors and the image-receiving sheet 5 for image registration, the surface of the support plate 4 on which the image-receiving sheet 5 is to be placed is provided with a white layer of anodized aluminum for allowing visible fine positional adjustment.

The assembly of the support plate 4, the image-receiving sheet 5, the image sheet 6, and the cover sheet 7 is sandwiched between a pair of upper and lower heated rollers and fed in the direction of the arrow (FIG. 1C) while being pressed and heated. During such a process, or in any other handling process, the support plate 4 serves to make the assembly rigid.

The cover sheet 7 has a thickness of about 100 microns, determined taking into account the desired thermal conductivity and ease of manipulation, and is made of plastics such as polyethyleneterephthalate (PET). The surface of the cover sheet 7 may be coated with silicone or a fluorine-contained resin to prevent the adhesion of the cover sheet 7 to the image sheet 6. The cover sheet 7 is effective in pressing the image sheet 6 and the image-receiving sheet 5 down against the support plate 4 to guard against positional displacement of the sheets 5 and 6. The cover sheet 7 also serves to prevent dust and dirt on the pressing and heating members or heated rollers from being deposited on the assembly and also to prevent the adhesive of an adhesive layer on the image-receiving sheet 5 from being deposited on the pressing and heating members. Since the support plate 4 is rigid, the assembly can be carried around easily, and the sheets can be protected against positional displacement during movement.

For transferring images of two or more colors, the image-receiving sheet 5 with a previous image transferred thereon and a next image sheet 6 are positioned relatively to each other in the manner described above, and adjusted slightly for image registration under visual supervision. Thereafter, the above image transfer cycle is repeated. The fine adjustment under visual supervision may be assisted by light illumination from a higher light source.

Although the support plate 4 and the cover sheet 7 have been described as being formed of aluminum and polyethyleneterephthalate, respectively, the present invention is not limited to such specific examples. The support plate 4 may be formed of any practical material, provided it has good thermal conductivity and rigidity. The cover sheet 7 is not restricted to plastics, but may be in the form of a thin metal sheet, provided it is a good thermal conductor and can be handled with ease. Although the surface of the support plate 4 has been described as being formed of anodized aluminum, the present invention is not limited to such specific example. The surface of the support plate 4 may be coated with white paint so as to enable fine positional adjustment for image registration.

As described above, before the image sheet 6 and the image-receiving sheet 5 are superposed and the image is transferred, the support plate 4 is placed beneath the image-receiving sheet 5 and the image sheet 6 is covered with the cover sheet 7. The overall assembly is therefore rendered rigid and protected from dust deposits. The assembly can easily be handled so that the transfer process can be effected efficiently.

With the assembly being of an increased degree of rigidity, the assembly is prevented from deformation such as warpage when pressed by the heated rollers. Accordingly, the image sheet 6 and the image-receiving sheet 5 are prevented from being positionally displaced and the sharpness of the image is increased.

Since the surface of the support plate 4 has a white anodized layer of aluminum, fine positional adjustment for image registration can easily be effected under visual supervision. In addition, the rigidity of the support plate 4 permits the assembly to be carried around easily and is effective in the prevention of positional displacement of the sheets.

The method of the invention is applicable to the re-transfer of a proof from the image-receiving sheet 5 to a print sheet and the matting of a test print on a print sheet.

We claim:

1. An image transfer device for transferring an image from an image sheet (6) to an image-receiving sheet (5) while said sheets are superposed, said image transfer device comprising:
    a plurality of heated rollers (14) for simultaneously feeding, heating, and pressing said superposed sheets;
    auxiliary heating means (22) for heating surfaces of said heated rollers, said auxiliary heating means being actuatable for heating only portions of said heated rollers where a surface temperature thereof is lowered due to insertion of said superposed sheets; and
    a sheet sensor (21) for generating a detecting signal indicative of said superposed sheets,
    wherein said auxiliary heating means is actuatable in response to said detecting signal.

2. The image transfer device according to claim 1, further comprising:
    preheating means (13) for preheating said superposed sheets prior to feeding, heating and pressing by said heated rollers;

cooling rollers (17) for feeding and cooling said superposed sheets between which an image has been transferred by said heated rollers; and cooling means (18,20) for additionally cooling said superposed sheets cooled by said cooling rollers.

3. An image transfer device for transferring an image from an image sheet to an image-receiving sheet while said sheets are superposed, said image transfer device comprising:

a plurality of heated rollers for simultaneously feeding, heating, and pressing said superposed sheets;

auxiliary heating means for heating surfaces of said heated rollers, said auxiliary heating means being actuatable for heating only portions of said heated rollers where a surface temperature thereof is lowered due to insertion of said superposed sheets;

a sheet sensor for generating a detecting signal indicative of said superposed sheets; and a timer for generating a timer signal, wherein said auxiliary heating means is actuatable in response to said detecting signal and said timer signal.

4. The image transfer device according to claim 3, further comprising:

preheating means for preheating said superposed sheets prior to feeding, heating and pressing by said heated rollers;

cooling rollers for feeding and cooling said superposed sheets between which an image has been transferred by said heater rollers; and cooling means for additionally cooling said superposed sheets cooled by said cooling rollers.

5. The image transfer device according to any one of claims 1-4, further comprising a temperature sensor for generating a detecting signal indicative of a surface temperature of said heated rollers, said auxiliary heating means being actuatable in response to said detecting signal.

6. The image transfer device according to any one of claims 1-4, further comprising a temperature sensor for generating a detecting signal indicative of a surface temperature of said heated rollers, and roller heating means for controlling the surface temperature of said heated rollers in response to said detecting signal generated by said temperature sensor, wherein said temperature sensor is disposed in contact with a surface portion of each of said heated rollers which will not contact said sheets.

7. An image transfer device for transferring an image from an image sheet (6) to an image-receiving sheet (5) while said sheets are superposed, said image transfer device comprising:

an image transfer path;

a plurality of heated rollers (14) for simultaneously feeding, heating, and pressing said superposed sheets on said image transfer path, said heated rollers contacting said sheets at a nipping point on said path;

auxiliary heating means (22) for heating surfaces of said heated rollers, said auxiliary heating means being actuatable for heating only portions of said heated rollers where a surface temperature thereof is lowered due to insertion of said superposed sheets; and a sheet sensor (21) for generating a detecting signal indicative of said sheets when said sheets are at a first distance ($L_1$) along said path and downstream of said nipping point, wherein said first distance ($L_1$) is equal to a second distance around the periphery of each of said heated rollers from the nipping point to a point where the portions of said heated rollers are heated by said auxiliary heating means, said auxiliary heating means being actuatable in response to said detecting signal.

8. A transfer method for transferring an image by superposing an image sheet with an image formed thereon upon an image-receiving sheet and by one of pressing said sheets and pressing and heating said sheets, comprising the steps of: placing a support plate of good thermal conductivity and rigidity against said sheets; superposing a cover sheet remotely from said support plate; and thereafter transferring said image.

9. The transfer method of claim 8, wherein said support plate is made of aluminum and has a thickness of about 0.5 mm.

10. The transfer method of claim 8, wherein said cover sheet has a thickness of about 100 microns and is made of plastics.

11. The transfer method of claim 8, wherein said transferring step comprises passing the assembly of said image sheet, said image-receiving sheet, said support plate and said cover sheet through a pair of rollers.

12. The transfer method of claim 11, wherein said pair of rollers are heated.

13. The transfer method of claim 8, further comprising the preliminary steps of providing positioning holes in said image sheet, said image-receiving sheet, and said support plate; aligning said positioning holes of said image sheet, said image-receiving sheet, and said support plate with a positioning plate having positioning pins extending through corresponding sets of said positioning holes; and, after said step of superposing said cover sheet, removing said positioning plate.

* * * * *